United States Patent
Caplet

(10) Patent No.: US 8,138,556 B2
(45) Date of Patent: Mar. 20, 2012

(54) PRE-RELEASED STRUCTURE DEVICE

(75) Inventor: Stéphane Caplet, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 489 days.

(21) Appl. No.: 12/338,174

(22) Filed: Dec. 18, 2008

(65) Prior Publication Data

US 2009/0261431 A1    Oct. 22, 2009

(30) Foreign Application Priority Data

Dec. 27, 2007 (FR) ...................... 07 60400

(51) Int. Cl.
*H01L 29/72* (2006.01)

(52) U.S. Cl. ......... 257/401; 257/418; 257/773; 257/777

(58) Field of Classification Search .................. 257/401, 257/418, 773, 777
See application file for complete search history.

(56) References Cited

U.S. PATENT DOCUMENTS

| 5,750,420 A | 5/1998 | Bono et al. |
| 2003/0162386 A1* | 8/2003 | Ogawa et al. ............. 438/637 |

FOREIGN PATENT DOCUMENTS

| EP | 0 754 953 A1 | 1/1997 |
| WO | 92/01941 A1 | 2/1992 |

OTHER PUBLICATIONS

Mochida et al; "A micromachined vibrating rate gyroscope with independent beams for the drive and detection modes", Sensors and Actuators 80 (2000) pp. 170-178.

* cited by examiner

*Primary Examiner* — Edward Wojciechowicz
(74) *Attorney, Agent, or Firm* — Pearne & Gordon LLP

(57) ABSTRACT

A pre-released structure device comprising:
- at least one first stacking, comprising at least one first layer based on at least one first material, arranged against a second stacking comprising at least one second layer based on at least one second material,
- at least one closed cavity, formed in the first and/or the second stacking, and arranged between a portion of the first stacking forming the pre-released structure and the second stacking,
- at least one spacer arranged in the cavity and linking the portion of the first stacking to the second stacking.

9 Claims, 6 Drawing Sheets

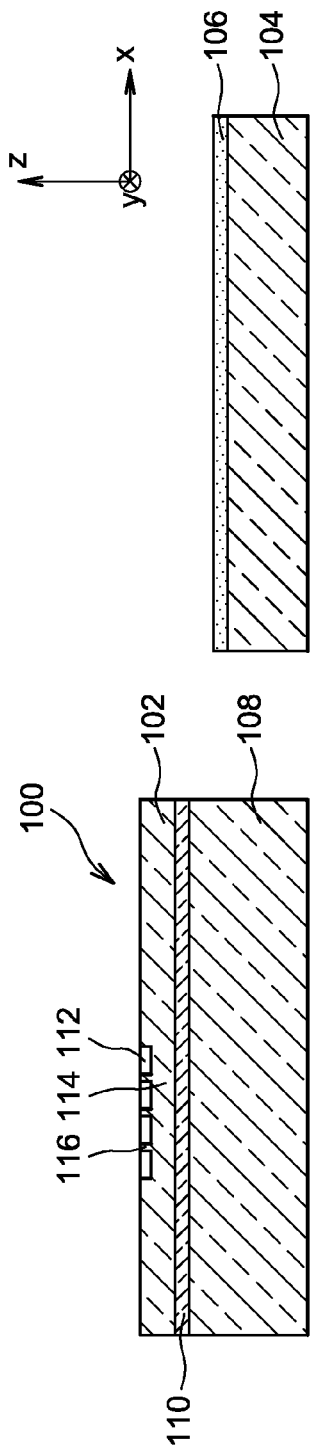
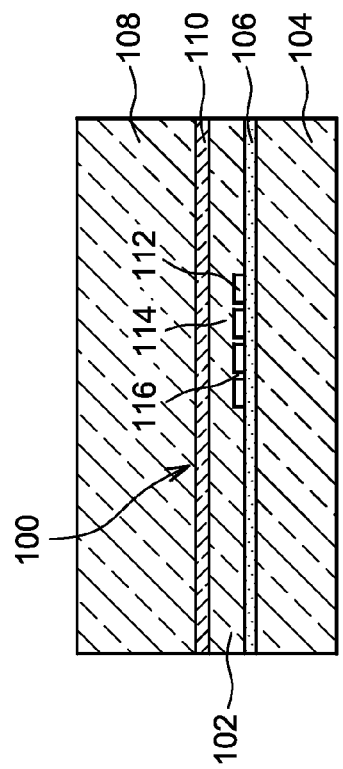

PRE-RELEASED STRUCTURE DEVICE

TECHNICAL FIELD

This document concerns a device comprising a pre-released structure formed in a useful layer as well as a method for producing such a device. This device may in particular be a micro-electro-mechanical system (MEMS) and/or a nano-electro-mechanical system (NEMS), for example a sensor, the pre-released structure comprising for example one or several moving elements of the MEMS or the NEMS. Said device may also comprise CMOS type elements intended to function after the structure release.

STATE OF THE PRIOR ART

Producing a MEMS from a SOI (silicon on insulator) substrate formed by an oxide layer arranged between a substrate and a useful layer based on silicon is known. The structure of the MEMS is firstly formed in the useful layer by lithography and etching steps. Release holes are then formed through the useful layer, making it possible to reach the oxide layer. Then the portion of the oxide layer linking the MEMS to the substrate is eliminated to release the MEMS, or certain elements of the MEMS intended to be moving elements, from the substrate. This elimination of the portion of the oxide layer is for example carried out by a wet etching implemented by an etching agent introduced into the release holes formed previously.

In such a method, an important number of release holes must in particular be formed in the useful layer so that the etching agent can completely eliminate the portion of the oxide layer linking the MEMS, or the moving elements of the MEMS, to the substrate, which weakens the MEMS. In addition, the time necessary to carry out this etching is long.

Document EP 0 754 953 A1 describes a method of releasing a micromechanical structure formed in a useful layer of a SOI substrate. In this method, a first partial and selective etching of the oxide layer is firstly carried out while leaving several portions of the oxide layer remaining, which then form spacers between the substrate and the portion of the useful layer forming the structure. An etching of the useful layer and the substrate is then implemented using the spacers as etching mask, thereby forming stops in the useful layer and in the substrate, at the level of the positions of the spacers, used as anti-bonding stops. Finally the spacers are eliminated, thereby completely liberating the micromechanical structure from the substrate.

These anti-bonding stops are useful when moving elements are capable of coming into contact with other elements of the structure, which may lead to a "bonding" of these elements. In case of bonding, the movement of the moving elements is no longer assured while the structure is functioning, thereby causing it to malfunction. The stops make it possible to limit the contact surface in case of collision and thus to reduce the risks of bonding of the moving elements of the structure.

Nevertheless, an important number of release holes must also be formed in the useful layer to carry out the first partial etching. In addition, the implementation time of this etching is also very long.

DESCRIPTION OF THE INVENTION

Thus there is a need to propose a pre-released structure device enabling a subsequent release of the structure, which may be faster than the structure releases described in the prior art, and in which the structure is not weakened by the formation of a high number of release holes in this structure.

To do this, one embodiment proposes a pre-released structure device comprising:
- at least one first stacking, comprising at least one first layer based on at least one first material, arranged on, or against, a second stacking comprising at least one second layer based on at least one second material,
- at least one cavity, for example closed, formed in the first and/or the second stacking, and arranged between a portion of the first stacking forming the pre-released structure and the second stacking,
- at least one spacer arranged in the cavity and extending between the portion of the first stacking and the second stacking, in other words linking or joining the portion of the first stacking to the second stacking.

The term "stacking", here and throughout the remainder of the document, must be understood as being "at least one layer".

With such a device, the release of the structure may be carried out very quickly since only one or the spacers arranged between the structure and the second stacking are intended to be released from the first or second stacking, which represents a smaller surface to be etched compared to the devices of the prior art in which a surface equivalent to that of the structure in contact with a substrate must be etched. In addition, given that a closed cavity is formed in one or the two stockings, which may extend fully under the pre-released structure formed by a portion of the first stacking, additional release holes in the structure are no longer necessary, a single access to the cavity being sufficient to entirely release the structure. This device thus offers greater freedom of conception as regards the design of the structure.

In addition, the pre-released structure according to this embodiment enables the implementation of steps of formation, or production, of MEMS, NEMS and/or MOS or CMOS devices before their release in, or on, or against, the pre-released structure, thereby making it possible to avoid a deformation of the structure even during steps leading to high temperatures. In addition, one or several MEMS and/or NEMS and/or MOS and/or CMOS type devices, or instead other types, may be formed in, or on, or against, the pre-released structure without design constraints on account of the absence of openings or access to the cavity in the structure.

Since the anchorings of the spacers are eliminated during the release of the structure, the device according to one embodiment may comprise a high density of spacers in the cavity particularly to optimise the mechanical holding, or the anchoring, of the pre-released structure, in particular when said structure withstands steps of the method leading to mechanical stresses. The density of spacers is therefore such that a sufficient mechanical holding of the pre-released structure is obtained.

Another embodiment proposes a pre-released structure device comprising at least one first layer based on at least one first material arranged on, or against, a second layer based on at least one second material, at least one cavity, for example closed, formed at least in the first layer and/or the second layer and arranged between a portion of the first layer, wherein said portion may be intended to form the structure, and the second layer, and at least one spacer, or micro-pillar, arranged in the cavity and extending between the portion of the first layer and the second layer, in other words linking or joining the portion of the first layer to the second layer.

The structure formed in the first stacking, which may comprise the useful layer, may comprise for example a sensitive element of a sensor, such as a seismic weight of an accelerometer or a membrane of a pressure sensor, or instead a moving element of a MEMS such as a comb.

The first and/or the second stacking may further comprise at least one intermediate layer arranged between the first layer and the second layer, wherein the cavity may be formed in the intermediate layer and/or the first layer and/or the second layer.

In this case, the intermediate layer may be based on a dielectric material such as an oxide of the first and/or the second material, and/or a semi-conductor oxide. The device may thus form a pre-released structure in a SOI substrate.

The device may comprise several groups of spacers, wherein the spacers of each group may comprise, in a plane parallel to a plane passing through a principal face of the first layer or the second layer or an intermediate layer (when the device comprises such an intermediate layer), a section different to the spacers of the other groups.

The device may comprise a plurality of spacers spread out in the cavity such that the distance between two neighbouring spacers is less than around fifty times the thickness of the portion of the first stacking.

The section of the spacers, in a plane parallel to a plane passing through a principal face of the first layer or the second layer, may be chosen as a function of the mechanical stresses that the structure may undergo before its release. This section may in particular be between around 7 $\mu m^2$ and 16 $\mu m^2$.

The first material may be a semi-conductor material. The second material may be a semi-conductor material, or dielectric material such as glass and/or silica. Thus, the structure may be formed in the useful layer of a silicon on glass, or silicon on borosilicate type substrate.

Another embodiment concerns a method for producing a pre-released structure device, comprising at least the steps of:
  forming at least one hollow in a first stacking, comprising at least one first layer based on at least one first material, and/or in a second stacking, comprising at least one second layer based on at least one second material while leaving at least one protuberance in the hollow remaining;
  bonding the first stacking on, or against, the second stacking, the hollow forming a cavity, for example closed, arranged between a portion of the first stacking forming the pre-released structure and the second stacking, the protuberance forming a spacer extending between the portion of the first stacking and the second stacking, in other words linking or joining the portion of the first stacking to the second stacking.

The first and/or the second stacking may further comprise at least one intermediate layer, wherein the hollow may then be formed in the intermediate layer and/or in the first layer and/or in the second layer, and the intermediate layer may then be arranged, after the bonding step, between the first layer and the second layer.

The step of forming the hollow may leave several groups of protuberances remaining, wherein the protuberances of each group may comprise, in a plane parallel to a plane passing through a principal face of the first layer or the second layer or an intermediate layer (when the device comprises such an intermediate layer), a section different to the protuberances of the other groups, wherein the protuberances may form, after the bonding step, spacers that may extend between the portion of the first stacking and the second stacking.

The method may further comprise a step of thinning of the first and/or the second stacking.

The method may further comprise a step of forming at least one weakened zone in the first and/or the second stacking, wherein the step of thinning may be carried out by the implementation of at least one fracture step at the level of the weakened zone.

The hollow and the protuberance may be obtained by the implementation of at least one lithography step and at least one etching step in the first and/or the second stacking.

The bonding step may be a molecular bonding or an anodic sealing carried out between the first and the second stacking.

Another embodiment also concerns a method for producing a structure in a device, comprising at least the steps of:
  implementing a method for producing a pre-released structure device as described previously;
  forming at least one access to the cavity;
  etching at least one portion of the first or the second stacking mechanically linking the spacer to the first or to the second stacking and/or all or part of the spacer, liberating the portion of the first stacking, from the second stacking.

Another embodiment also concerns a method of releasing a structure of a device as described previously, comprising at least the steps of:
  forming at least one access to the cavity;
  etching at least one portion of the first or second stacking mechanically linking the spacer to the first or to the second stacking and/or all or part of the spacer, liberating the portion of the first stacking, from the second stacking.

The spacer(s), or micro-pillars, thus fulfil, before the release of the structure, both the functions of mechanical support and thermal bridge during the steps carried out on the structure before the release, and may form, after the release of the structure, pins, or stops, which make it possible to assure an anti-bonding function, in other words protuberances reducing the risks of bonding of the released structure with in particular the second layer when the structure is moving and that this comes into contact with the second layer.

The formation of the access to the cavity may be obtained by at least one lithography step and at least one etching step.

The etching step may also carry out the etching of all or part of the spacers.

BRIEF DESCRIPTION OF DRAWINGS

The invention will be better understood on reading the description of embodiments given purely by way of indication and in no way limiting and by referring to the appended figures in which:

FIGS. 1 to 3 represent the steps of a method for producing a pre-released structure according to a first embodiment;

Identical, similar or equivalent parts of the different figures described hereafter bear the same number references so as to make it easy to go from one figure to the next.

In order to make the figures easier to read, the different parts represented in the figures are not necessarily to the same scale.

The different possibilities (alternatives and embodiments) should be understood as not been mutually exclusive and may be combined together.

DETAILED DESCRIPTION OF SPECIFIC EMBODIMENTS

Figure 3:
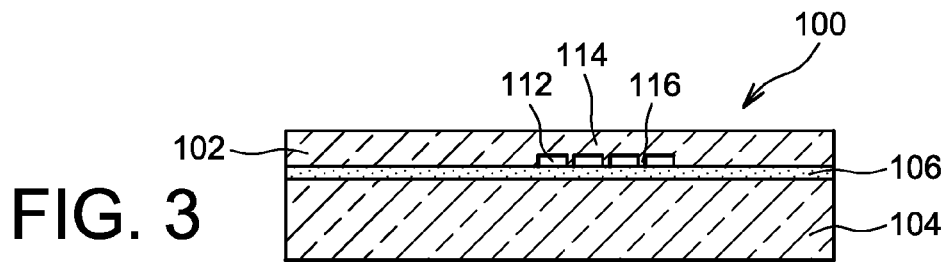

Reference will firstly be made to FIGS. 1 to 3 which represent the steps of a method for producing a pre-released structure device 100 formed in a useful layer 102 linked to a substrate 104, according to a first embodiment.

As represented in FIG. 1, a dielectric layer 106 is firstly formed on a first substrate 104. In this embodiment described, the first substrate 104 is based on at least one semi-conductor, for example silicon, the dielectric layer 106 being based on an oxide, for example silicon oxide obtained by oxidation of the silicon of the substrate 104.

A first stacking formed by a second substrate 108, also based on at least one semi-conductor such as silicon, on which is formed a layer 110 based on at least one material different to that of the second substrate 108 is also formed. In the embodiment described here, this layer 110 is a sacrificial layer, for example based on semi-conductor oxide or semi-conductor such as silicon-germanium, enabling a subsequent thinning of the first stacking formed by the second substrate 108, the sacrificial layer 110 and the useful layer 102. The useful layer 102, here based on at least one semi-conductor such as silicon, is then formed on the sacrificial layer 110. Generally speaking, the useful layer 102 has for example a thickness between around 5 µm and 4 mm, and preferably between around 5 µm and 200 µm. In addition, the materials of the layers 102 and 106 are chosen such that the material of the layer 106 may be etched selectively compared to that of the useful layer 102. The first substrate 104 and the dielectric layer 106 form a second stacking.

Steps of lithography and etching in the useful layer 102 are then carried out, forming a hollow 112. This hollow 112 is formed above a portion 114 of the useful layer 102 from which the pre-released structure is going to be formed. The dimensions of this hollow 112 are adapted as a function of the size and the shape of the desired structure. The hollow 112 has for example dimensions equal to several hundreds of micrometers, in other words less than around 1 mm. The pattern lithographied and etched in the useful layer 102 also forms protuberances 116 in the hollow 112, above the portion 114 of the useful layer 102. In FIG. 1, three protuberances 116 are represented. In this embodiment example, the hollow 112 is formed in the first stacking.

The protuberances 116 are here spread out in a relatively homogeneous manner in the hollow 112, with a step, in other words a spacing between two neighbouring protuberances 116, equal to several micrometers, for example between around 5 µm and 15 µm. The protuberances 116 have for example, in a plane parallel to the plane (x,y), which is for example the principal plane of the useful layer 102, a section in which the surface is between around 7 µm$^2$ and 16 µm$^2$. This section is for example of rectangular shape, the dimensions of the sides being between around 3 µm and 4 µm, or has a disc shape, the radius of which is between around 3 µm and 4 µm. This section may also be of any other shape, regular or not. The depth of the hollow 112 is adapted as a function of the thickness of the useful layer 102.

The depth of the hollow 112 is particularly chosen so as not to mechanically weaken the layer 102. In addition, this depth of the hollow 112 is chosen to obtain a uniformity of release etching at the level of the zones positioned between two access openings (holes or trenches) for the etching agent used during the subsequent release of the structure, and so that the etching agent may be conveyed everywhere in the hollow and eliminate the elements intended to be etched. In the case of a stacking forming a SOI substrate with a hollow formed in the superficial layer, this depth is for example equal to the thickness of the oxide layer.

As represented in FIG. 2, a bonding, for example a molecular bonding, between the dielectric layer 106 and the useful layer 102 is then carried out. The hollow 112 thus forms a closed cavity arranged between the dielectric layer 106 and the portion 114 of the useful layer 102. The protuberances 116 also form spacers, or micro-pillars, extending between the portion 114 of the useful layer 102 and the dielectric layer 106, in the cavity 112, in other words linking or joining the portion 114 of the useful layer 108 to the dielectric layer 106.

As represented in FIG. 3, the second substrate 108 and the layer of SiGe 110 are then eliminated, for example by sacrificial etching of the oxide or HF. A device 100 comprising a pre-released structure formed by the portion of semi-conductor 114 of the useful layer 102 linked to the substrate 104 through the intermediary of a portion of the dielectric layer 106 and spacers 116 is then obtained. The spacers 116 thus here serve as mechanical support to the portion 114, as well as thermal bridge.

Figure 4:
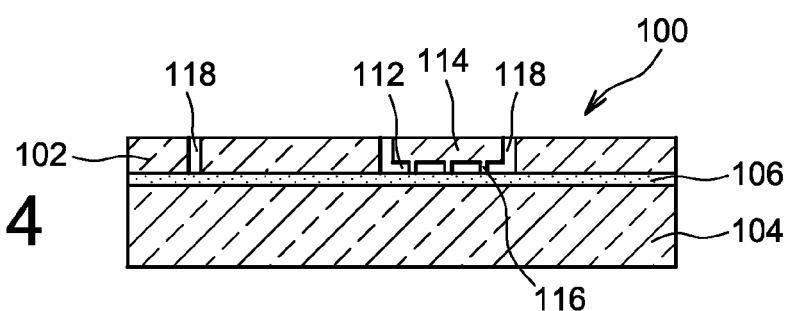
FIGS. 4 and 5 represent steps of a method for producing a structure in a device, or of a method of releasing a structure of a device, according to a first embodiment, from a pre-released structure.
Figure 5:
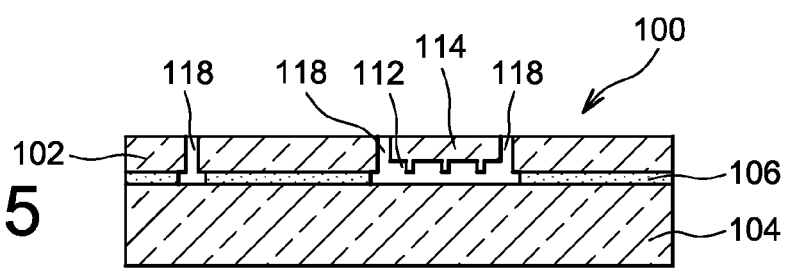

Reference will now be made to FIGS. 4 and 5 which represent steps of forming the structure in the device 100, from the pre-released structure device 100 described previously and represented in FIG. 3.

In FIG. 4, the portion 114 of the useful layer 102, in other words the pre-released structure of the device 100, is shaped by lithography and etching steps. In the embodiment example described, the device 100 is a MEMS, for example an accelerometer, the structure formed by the portion 114 of the useful layer 102 being intended to be a suspended membrane. In FIG. 4, insulation trenches 118 formed through the useful layer 102 shape and delimit the structure of the remainder of the useful layer 102. These trenches 118 also form an access to the cavity 112 and to the dielectric layer 106, and particularly to the portions of the dielectric layer 106 linked to the spacers 116.

As represented in FIG. 5, the structure formed by the portion 114 is then released from the substrate 104 by etching, for example, by a wet etching with hydrofluoric acid, the portions of the dielectric layer 106 linking the spacers 116 to the substrate 104, enlarging the cavity 112 formed previously. The structure formed by the portion 114 of the useful layer 102 is thus released from the substrate 104, as well as the dielectric layer 106.

Compared to the methods of the prior art, the release of the structure according to the method described does not necessitate forming additional release holes in the portion 114 of the useful layer 102 so as to be able to introduce into them an agent for etching the dielectric layer 106. Indeed, given that the cavity 112 makes it possible to access all the portions of the dielectric layer 106 linked to the spacers 116, the etching agent may attain the totality of these portions of the dielectric layer 106 linking the portion 114 of the useful layer 102 to the substrate 104 uniquely from trenches 118 delimiting the structure. In addition, given that the spacers 116 are formed in the useful layer 102 before this layer is assembled to the substrate 104 and to the dielectric layer 106, the spacers 116 may be formed without forming numerous holes in the portion 114 of the useful layer 102 which would weaken the portion 114. Several additional release holes may nevertheless be formed through the useful layer if it is wished to improve the fluid distribution of the etching agent during the sacrificial etching.

This method also makes it possible to reduce the release time of the structure. For example, in the methods of the prior art described previously, it is necessary to form release holes spaced apart by around 30 µm in the portion of semi-conductor intended to form the structure. The time for the release of the structure is in this case the time taken by the etching agent to etch a portion of oxide (in the case of a SOI substrate) forming a cylinder of diameter slightly less than half the distance between two holes, for example around 15 µm. This time may be reduced by bringing the release holes closer together, but this implies an even higher number of release holes in the structure to be released, which can further weaken the structure. In the device described here, the release time of the structure corresponds to the time taken to etch the portions of the dielectric layer 106 positioned under the spacers 116, in other words portions whose dimensions in a plane parallel to the principal plane (x,y) of the useful layer 102 are between around 3 µm and 4 µm, i.e. an etching time around five times less than that necessary in the methods of the prior art.

In addition, after the release of the structure, the spacers 116 form stops making it possible to reduce the risk of bonding between the structure and the substrate 104, thanks to a reduced surface contact in case of contact.

In an alternative of the embodiment described, it is possible to replace the substrate 104 and the dielectric layer 106 by a single layer forming a substrate. In this case, this substrate may be based on glass, for example of borosilicate type. The bonding between the useful layer 102 and this substrate may then be formed by a molecular bonding or an anodic sealing. In this alternative embodiment, the release of the structure is then obtained by etching the anchorings, in other words the portions of the substrate linked directly to the spacers. This etching may be an isotropic etching with hydrofluoric acid.

All of the advantages described previously in relation to the device 100 also apply with this alternative: release of the structure without the numerous release holes in the useful layer, reduction in the release time of the structure, presence of spacers forming anti-bonding stops. It is also possible to form the cavity in the useful layer only under one part of the portion of the useful layer intended to form the structure. For example, in the case of an interdigital comb MEMS, it is possible only to form the cavity under the portion of the useful layer intended to form a moving comb, the cavity not being formed under the portion of the useful layer intended to form the fixed combs.

Reference will now be made to FIGS. 6 to 10 which represent the steps of forming a pre-released structure device 200 and the release of this structure according to a second embodiment.

Figure 6:
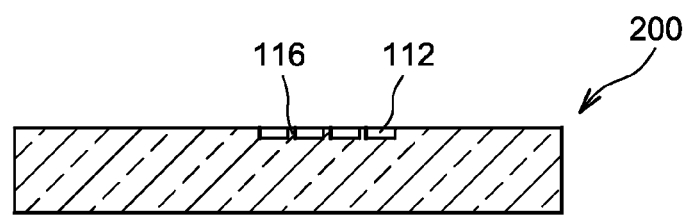
FIGS. 6 to 10 represent the steps of a method for producing a pre-released structure, according to a second embodiment, and the steps of a method for releasing a structure of a device, according to a second embodiment, from a pre-released structure.

As represented in FIG. 6, compared to the first embodiment, the hollow 112 and the protuberances 116 are formed in a solid substrate 202, here based on silicon, for example by lithography and reactive ion etching (RIE) steps. The depth of the hollow 112 is here equal to several hundreds of nanometers, in other words less than around 1 micrometer. The substrate 202 is designated first stacking.

Figure 7:
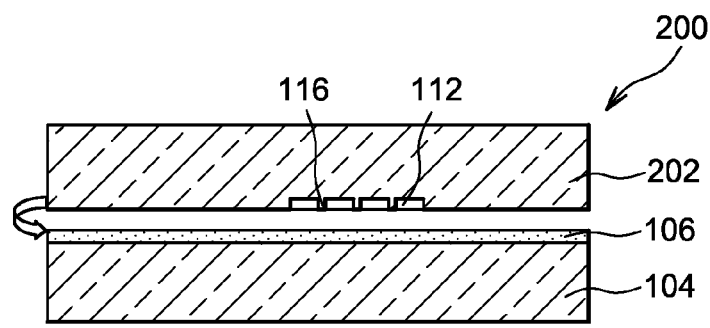

The substrate 202 is then joined by sealing to the second stacking formed by the substrate 104 based on silicon and the dielectric layer 106 based on silicon oxide (FIG. 7).

Figure 8:
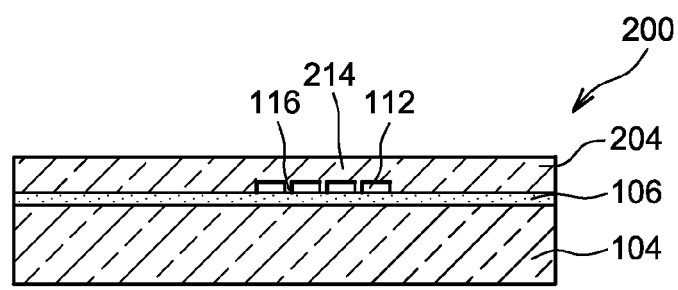

In FIG. 8, the substrate 202 is thinned to the desired thickness, thereby forming a layer 204 of silicon. The substrate 104, the oxide layer 106 and the layer 204 thus form a SOI structure, the layer 204 forming the useful silicon layer of this structure. A portion 214 of the layer 204 positioned above the cavity 112 forms the pre-released structure of the device 200.

Figure 9:
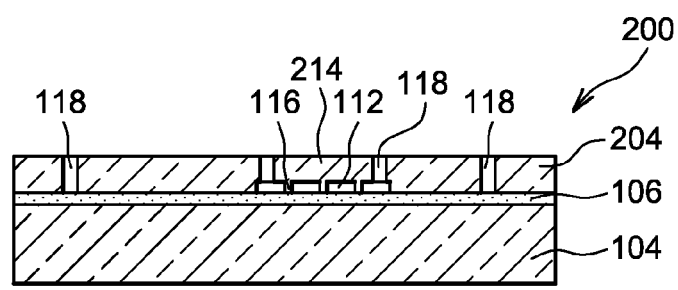

The portion 214 of the useful layer 204 is shaped by lithography and etching steps, for example RIE (FIG. 9). As in the first embodiment described previously, insulation trenches 118 formed through the useful layer 204 shape and delimit the structure of the remainder of the useful layer 204. These trenches 118 also form an access to the cavity 112 and to the dielectric layer 106, and particularly to the portions of the dielectric layer 106 linked to the spacers 116.

Figure 10:
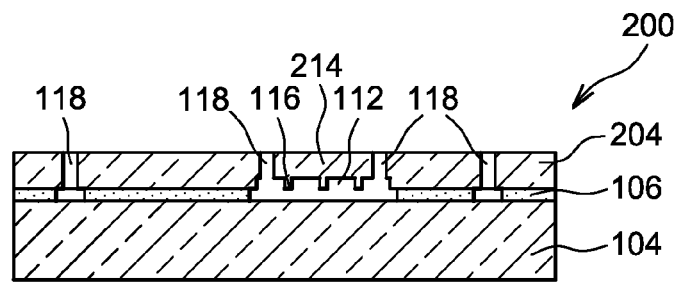

Finally, as represented in FIG. 10, the structure formed by the portion 114 is then released from the substrate 104 by etching the portions of the dielectric layer 106 linked to the spacers 116.

Figure 11:
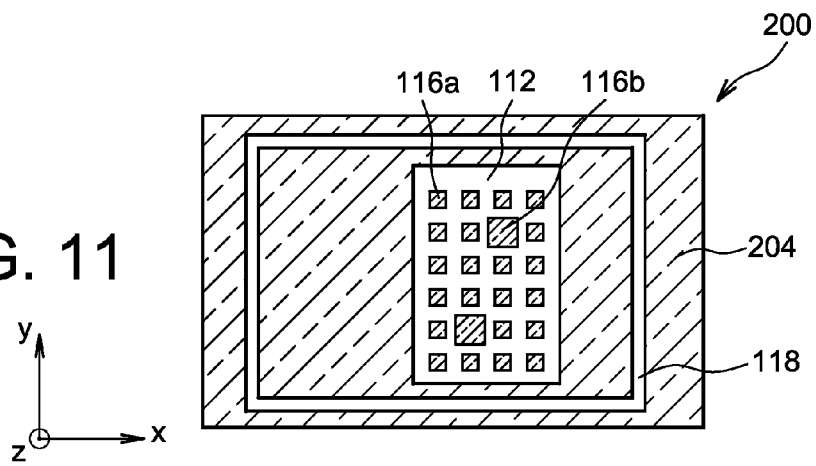
FIG. 11 represents a top section view of a pre-released structure device in an alternative of the second embodiment.

In an alternative of the embodiments described previously, it is possible to form, in the cavity of the pre-released structure device, spacers, the distribution density of which in the cavity is substantially uniform and comprising, in a plane parallel to the principal plane of the device, different section dimensions. FIG. 11 represents a sectional view of the device 200 (in a principal plane of the layer 204) according to this alternative embodiment. As may be seen in this FIG. 11, a first group of spacers 116a comprises a section of dimensions less than those of the section of a second group of spacers 116b.

In this alternative embodiment, the release of the portion 114 forming the structure is carried out in two steps: firstly the portions of the dielectric layer 106 linking the first group of spacers 116a to the substrate 104 are etched then, by a second etching the portions of the dielectric layer 106 linking the second group of spacers 116b to the substrate 104 are released. Between these two etching steps, it is possible to form anti-bonding stops in the layer 204, at the level of spacers 116b still present in the cavity 112, by implementing for example the method described in document EP 0 754 953 A1.

The dimensions of the sides of the cavity 112 in the plane (x,y) may for example be equal to several hundreds of micrometers, or less than around 1 mm. When the portion of the layer 204 positioned above the cavity 112 is intended to form a MEMS, the spacers 116a have for example a section, in the plane (x,y), the dimensions of the sides of which are between around 3 µm and 5 µm, two neighbouring spacers 116a being for example distant by a length of between around 8 µm and 15 µm. When the portion of the layer 204 positioned above the cavity 112 is intended to form a NEMS, the spacers 116a may in this case have their section in the plane (x,y) the sides of which have dimensions between around 0.2 µm and 0.5 µm, spaced apart by a step (distance between two neighbouring spacers) between around 1 µm and 2 µm. The sections of the spacers 116b in the plane (x,y) may have sides of which the dimensions are greater than around 3 µm to 5 µm compared to the dimensions of the sections of the spacers 116a. The dimensions of the spacers may be further reduced if advanced lithography means are used. For example, in the case of spacers 116a the dimensions of the sections in the plane (x,y) of which are equal to around 1 µm, the spacing step may be between around 0.2 µm and 0.5 µm.

Figure 12:
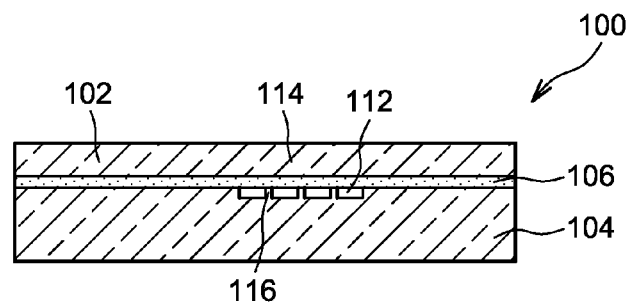
FIG. 12 represents a pre-released structure device in an alternative of the first embodiment.

In the embodiments described previously, the cavity 112 is formed in the first stacking, in other words in the layer(s) that are transferred onto the second stacking (in the layer 102 for the device 100 and in the layer 202, 204 for the device 200). In an alternative of the previous embodiments, it is possible to form the cavity 112 and the spacers 116 in the second stacking, in other words in the substrate 104. In this case, the cavity 112 is formed between a portion of the substrate 104 and the dielectric layer 106. In this case, the release may be carried out in a similar manner to the embodiments described previously, in other words by etching the first stacking (layer 102 or layer 204) and the dielectric layer 106 to convey the etching agent into the cavity 112 and thereby release the portion 114 of the layer 102 or the layer 204 intended to form the released structure. FIG. 12 represents the device 100 in this alternative embodiment.

Figure 13A:
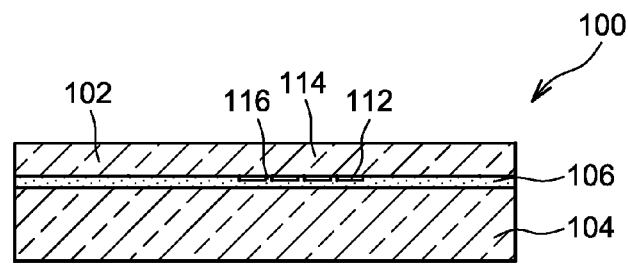
FIGS. 13A and 13B represent a pre-released structure device, respectively before and after the release of the structure, in an alternative of the first embodiment.
Figure 13B:
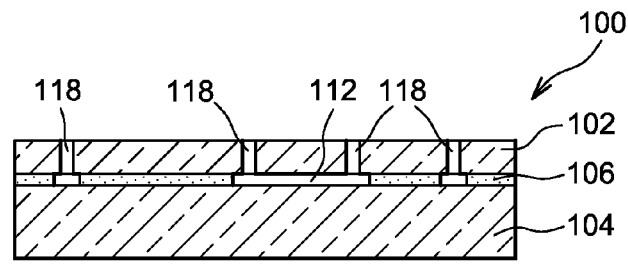

In another alternative, the cavity 112 and the spacers 116 may be formed in the dielectric layer 106. FIG. 13A represents the device 100 in this alternative embodiment. Once the structure formed by the portion 114 of the layer 102 is then released (see FIG. 13B), the whole of the portion of the dielectric layer 106 positioned at the level of the cavity 112 is etched. Unlike the examples described previously, the spacers 116 are no longer present in the cavity 112 after the release of the pre-released structure.

An example of forming a pressure sensor 1000 from a pre-released structure SOI substrate will now be described while referring to FIGS. 14A to 14F.

Figure 14A:
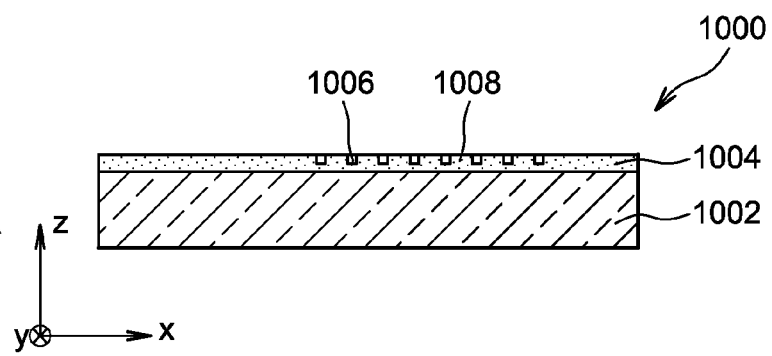
FIGS. 14A to 14F represent the steps of a method for producing a pressure sensor from a pre-released structure SOI substrate.

As represented in FIG. 14A, a thermal oxidation of a silicon substrate 1002 is firstly carried out, forming a silicon oxide layer 1004 of thickness between around 0.2 µm and 0.4 µm. A cavity 1006 comprising protuberances 1008 is then formed in the oxide layer 1004, for example in a similar manner to the cavity 112 described previously. The protuberances 1008 here have a section, in a plane parallel to the plane (x,y), the sides of which have dimensions between around 0.5 µm and 1 µm. The spacing step between the protuberances 1008 is for example between around 0.1 µm and 0.2 µm. The cavity 1006 is formed in the oxide layer 1004 over a depth between around 0.1 µm and 0.2 µm.

Figure 14B:
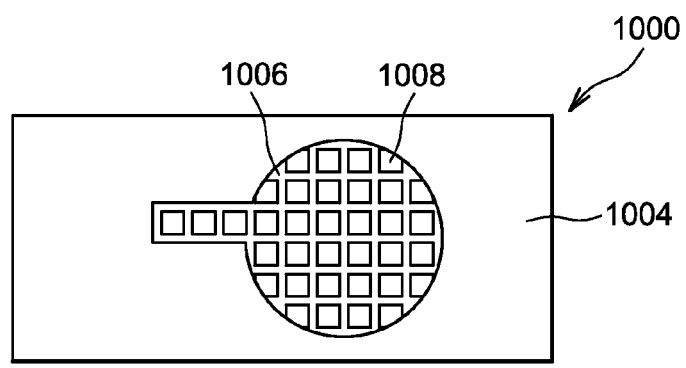

As is represented in FIG. 14B which represents a top view of the sensor 1000, the pattern of the cavity 1006 comprises a disc intended to delimit the future membrane of the sensor 1000. This pattern also comprises one or several channels intended to deport the formation of the release opening(s). The membrane of the sensor 1000 is thus maintained intact.

Figure 14C:
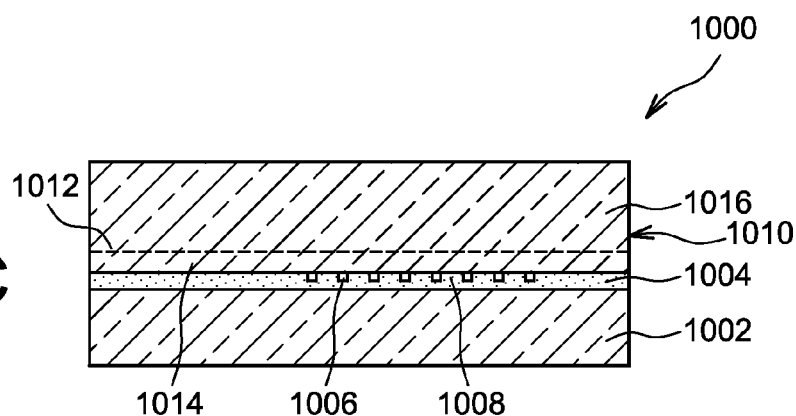

A molecular bonding is then carried out of a silicon substrate 1010, for example monocrystalline, comprising a weakened zone 1012 created prior to the molecular bonding (FIG. 14C). The weakened zone 1012 separates the substrate 1010 into two layers 1014 and 1016. The cavity 1006 thus becomes a closed cavity, the protuberances 1008 then forming spacers extending between the substrate 1010 and the stacking formed by the oxide layer 1004 and the substrate 1002. The density of the spacers 1008 is in particular chosen so that the molecular bonding wave propagates well and the bonding takes place at the level of the spacers 1008. In this embodiment example, the cavity 1006 is thus formed in the oxide layer 1004.

Figure 14D:
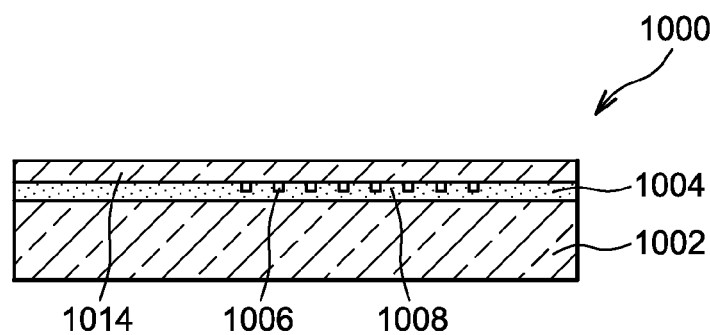

In FIG. 14D, a fracture of the substrate 1010 is made at the level of the weakened zone 1012, thereby eliminating the layer 1016 of the device 1000. This fracturing step may be followed by a chemical mechanical polishing step of the surface of the layer 1014 stemming from the substrate 1010. The density of the spacers 1008 is also chosen to assure a good mechanical resistance of the layer 1014 during the fracture step.

Figure 14E:
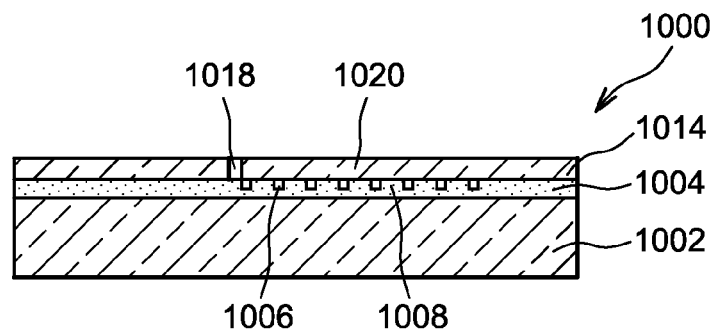

At least one opening 1018 is then formed through the layer 1014 before forming an access to the cavity 1006 (FIG. 14E). When the pattern of the cavity 1006 comprises an access channel, the opening(s) are formed through the layer 1014 at the level of this access channel, thus leaving intact a portion 1020 of the layer 1014 intended to form the membrane of the sensor 1010.

Figure 14F:
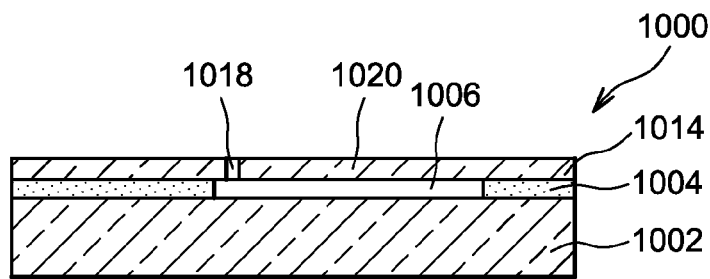

As represented in FIG. 14F, an etching of the material of the oxide layer 1004 positioned at the level of the cavity 1006 is then carried out, thereby liberating the membrane formed by the portion 1020 of the silicon layer 1014. The release opening(s) 1018 may then be filled for example by a vacuum deposition, the deposited material then being etched selectively by a step of lithography and etching, which makes it possible to only conserve the material previously deposited at the level of the openings 1018.

The invention claimed is:

1. A pre-released structure device comprising:
   at least one first stacking, comprising:
      at least one first layer based on at least one first material, arranged against
   a second stacking, comprising:
      at least one second layer based on at least one second material,
   at least one closed cavity, formed in the first and/or the second stacking, and
      wherein the closed cavity is arranged between a portion of the first stacking forming the pre-released structure and the second stacking, and
      wherein the closed cavity is closed to the exterior of the pre-released structure device; and
   at least one spacer arranged in the closed cavity and linking the portion of the first stacking to the second stacking.

2. The device according to claim 1,
   in which the first and/or the second stacking further comprise at least one intermediate layer arranged between the first layer and the second layer,
   wherein the cavity formed in the intermediate layer and/or the first layer and/or the second layer.

3. The device according to claim 2, in which the intermediate layer is based on a dielectric material such as an oxide of the first and/or the second material, and/or a semi-conductor oxide.

4. The device according to claim 1, comprising several groups of spacers, the spacers of each group comprising, in a plane parallel to a plane passing through a principal face of the first layer or the second layer or an intermediate layer, a section different to the spacers of the other groups.

5. The device according to claim 1, comprising a plurality of spacers spread out in the cavity such that the distance between two neighbouring spacers is less than around fifty times the thickness of the portion of the first stacking.

6. The device according to claim 1, in which the first material is a semi-conductor material.

7. The device according to claim 1, in which the second material is a semi-conductor material, or a dielectric material such as glass and/or silica.

8. The device according to claim 1, comprising in the first and/or the second stacking,
   at least one weakened zone enabling the subsequent carrying out of a thinning of the first and/or the second stacking.

9. The device according to claim 1,
   wherein at least one portion of the first or the second stacking comprises a material for etching,
   wherein by
      forming at least one access to the closed cavity, and then etching the material, exposed by the closed cavity, of said at least one portion of the first or the second stacking mechanically linking the spacer to the first or to the second stacking and/or all or part of the spacer, and thus
      causing the liberating of the portion of the first stacking, from the second stacking.

* * * * *